United States Patent [19]

Rossetti

[11] 4,289,829

[45] Sep. 15, 1981

[54] METHOD FOR METALLIZING CERAMIC SUBSTRATES AND NEW, THUS OBTAINED PRODUCTS

[75] Inventor: Pierre C. Rossetti, Fontenay aux Roses, France

[73] Assignee: Silec-Semi-Conducteurs, Paris, France

[21] Appl. No.: 52,015

[22] Filed: Jun. 25, 1979

Related U.S. Application Data

[63] Continuation of Ser. No. 845,841, Oct. 26, 1977, abandoned.

[30] Foreign Application Priority Data

Dec. 1, 1976 [FR] France ............................. 76 36243

[51] Int. Cl.³ .............................................. B32B 9/00
[52] U.S. Cl. .................................... 428/469; 427/229; 427/266; 427/282; 427/377; 427/383.5
[58] Field of Search .................. 427/229, 377, 248 E, 427/282, 266, 383 B, 226, 255.4, 383.5; 428/469

[56] References Cited

U.S. PATENT DOCUMENTS

| | | | |
|---|---|---|---|
| Re. 28,506 | 8/1975 | Quaintance et al. | 428/469 |
| 3,629,150 | 12/1971 | Shannon | 428/469 |
| 3,734,767 | 5/1973 | Church et al. | 427/226 |
| 3,982,941 | 9/1976 | Inskip | 427/226 |
| 4,016,308 | 4/1977 | Frazee | 427/383 B |
| 4,025,669 | 5/1977 | Greenstein | 427/226 |
| 4,129,434 | 12/1978 | Plumat et al. | 427/383 B |

FOREIGN PATENT DOCUMENTS 157052 6/1954 Australia ...................... 427/383 B

*Primary Examiner*—Ronald H. Smith
*Assistant Examiner*—Janyce A. Bell
*Attorney, Agent, or Firm*—Cushman, Darby & Cushman

[57] ABSTRACT

Method of metallizing a ceramic substrate so as to obtain on this substrate weldable metallized zones or areas usable at a high temperature, characterized by depositing on a ceramic substrate, an ink including cobalt oxide and forming a hooking layer by forming a compound between the ceramic and cobalt oxide, under an oxidizing atmosphere, and, reducing at about 1,100° C., the oxide superficially so as to obtain a cobalt metal layer and metallized zones or areas weldable by a method known per se.

6 Claims, No Drawings

METHOD FOR METALLIZING CERAMIC SUBSTRATES AND NEW, THUS OBTAINED PRODUCTS

This is a continuation of application Ser. No. 845,841 filed Oct. 26, 1977, now abandoned.

The present invention relates to a method for metallizing ceramics and, more particularly, it concerns a method of forming zones or areas on ceramic substrates, these metallized zones being weldable and usable at a high temperature.

A method for almost all metallizations of ceramics at high temperature is known. This technic is designated as "moly-manganese technology".

Ceramics are now broadly used in the manufacture of high performance electronic components. In most of the applications, the ceramic should form a solid bond with a metal. The ordinary method consists of applying a thin layer of molybdenum metal painting on the surface of the ceramic and then baking at about 1,500° C. under a reducing atmosphere. The addition of a small amount of manganese dioxide improves the bonding resistances and this technic is often called "moly-manganese method or technology" (see the article by Twentyman in Journal of Materials Science 10 (1975) 765–766). These molybdenum-manganese mixtures form a manganese aluminate spinel $MnOAl_2O_3$, which penetrates into the ceramic substrate (see the article by Paul Sayers in Solid State Technology, September 1974).

The metallized moly-manganese layers are nickel coated, since, without coating with nickel, moly-manganese does not accept any welding, is not easily wetted by numerous brazing alloys and is sensitive to corrosion under high humidity conditions. This nickel deposit is realized by applying a NiO painting and by reducing the oxide in hydrogen at about 950° C.

The main drawback of the "moly-manganese" technic is the high treatment temperature (about 1,500° C.). A method making it possible to create weldable metallized zones on ceramic substrates at a lower temperature than that used in the "moly-manganese" technic would be an important achievement in this field.

An object of the present invention is therefore to provide a method for metallizing ceramic substrates, by using lower temperatures than those conventionally used.

Other objects will appear to one skilled in the art to which the present invention relates.

This object is now obtained by means of the present invention, by the provision of a method for metallizing ceramic substrates so as to obtain on this substrate weldable metallized zones which can be used at a high temperature, characterized in that, on a ceramic substrate, an ink including a cobalt oxide is deposited, a hooking layer is formed by forming a compound between the ceramic and cobalt oxide, under an oxidizing atmosphere at about 1,100° C., and reducing the oxide superficially so as to obtain a cobalt metal layer and weldable metallized zones or areas are deposited by a process known per se.

This method makes it possible to obtain excellent hooking and weldability qualities, with the aid of fewer and easier operations than in the conventional "moly-manganese" technology, by using a treatment temperature (about 1,100° C.) lower than that of the conventional process (1,500° C.). It should be noted that, in this process, any ceramic substrate, such as $Al_2O_3$, BeO or MgO can be used.

In the following portion of the specification, details on the various process steps will be given:

(1°) Preparation of ink on basis of cobalt oxide

This ink is prepared by suspending finely pulverized cobalt oxide in collodion.

A particularly preferred collodion is that one formed by a dissolution of nitrocellulose in a butylcarbitol acetate.

The cobalt oxide is particularly composed of a commercially available mixture composed of two oxides $Co_2O_3$ and $Co_3O_4$.

However, any other cobalt oxide such CoO can be used.

Alternatively, cobalt oxide can be formed in situ on the ceramic, by depositing onto the substrate metal cobalt which will be oxidated during the further thermal treatment under oxidating atmosphere.

(2°) Deposition

Any method for depositing the cobalt oxide suspension in a collodion can be used, but serigraphy is specially preferred since very often localized deposits are looked after.

After deposition, the deposit is simply subjected drying in air. The drying temperature will depend upon the used solvent and, in the case of a nitrocellulose dissolution in a butylcarbitol acetate, the drying temperature will be about 110° C.

After drying, other deposits can be applied (for example on the other face of the substrate).

(3°) Thermal treatments

In the method of the present invention, a double thermal treatment, first under oxidizing atmosphere, and thereafter under reducing atmosphere are used.

As previously indicated, the thermal treatment under oxidizing atmosphere is carried out at about 1,100° C. and makes it possible to form a hooking layer by creating a compound between the ceramic substrate and cobalt oxide (or metal cobalt oxidized in situ during the first thermal treatment).

As an oxidizing atmosphere, air is preferred, but oxygen or oxygen enriched air can be used, the baking lasting for about 15 minutes.

After formation of the hooking layer, a superficial reduction treatment of cobalt oxide into metal cobalt is obtained by modifying the atmosphere to become a atmosphere, this treatment taking place for about 15 minutes.

As the reducing atmosphere, hydrogen or hydrogenated nitrogen can be used for example.

Due to this reduction treatment, a surface of metal cobalt is formed on which can be deposited metal layers intended for improving weldability and/or corrosion resistance.

(4°) Deposition of weldable layers

Methods used conventionally on deposits of the moly-manganese kind, namely application of a NiO paint and reduction of the oxide in hydrogen at about 950° C. or through electrolytic coating, are used.

However, a particularly advantageous method consists of producing a deposit of catalytic nickel by a "phosphorus" or "boron" process by using commercially available baths known under various denominations. As an example of this bath, a bath called "Niposit 468", having a nickel content of 98.5%, a boron content of 0.25%, and not including phosphorus or containing dimethylaminoborane as a reducing agent can be used. Another bath is "NL 65" the nickel content of which is 90%, which includes 10% of phosphorus and which does not contain boron.

In the following portion of the specification, a preferred embodiment of the present invention will be given, it being well understood that this example is only given for illustration purposes and not in a limitative way.

EXAMPLE

Cobalt oxide is deposited on a face of an aluminum substrate by a serigraphy method. As previously indicated, cobalt oxide is present as a dispersion of the mixture $Co_2O_3 + Co_3O_4$ in a collodion, preferably a nitrocellulose dissolution in a butylcarbitol acetate.

The deposit thickness is comprised between about 15 and 20 microns.

The ink is dried in a stove at 110° C. for 10 minutes or more and, by the same method as previously indicated, cobalt oxide is deposited on the other face, according to a thickness of about 15 to 20 microns.

It is proceeded to a drying at 110° C. for 10 minutes or more, and the aluminum substrate covered with cobalt oxide on both faces is introduced into an oven at 1,100° C. under an oxidizing atmosphere (air).

Curing is applied for 15 minutes and the oxide is reduced by modification of the atmosphere which becomes reducing (hydrogen or hydrogenated nitrogen). This operation takes place for 15 minutes, then the alumina substrate covered with the cobalt metal layer is taken away.

The quality of hooking was checked by etching cobalt with a suitable reagent, for example a mixture of nitric and hydrofluoric acid. An alumina and cobalt compound is formed which appears with a beautiful blue colour (Thenard blue).

What I claim is:

1. A method of metallizing an alumina substrate to obtain weldable metallized zones or areas thereon usable at a high temperature, said method consisting essentially in the sequential steps of:
    (a) depositing on said substrate an ink composed of a dispersion of a cobalt oxide in collodion,
    (b) forming a compound between said substrate and cobalt oxide, in an oxidizing atmosphere, at about 1,100° C., and thereafter
    (c) reducing the oxide superficially to obtain a cobalt metal layer on which weldable metallized zones or areas may be deposited.

2. A method according to claim 1, wherein a mixture of $Co_2O_3$ and $Co_3O_4$ is dispersed in a nitrocellulose solution in a butylcarbitol acetate solvent.

3. A method according to claim 1, wherein the ink is deposited onto the substrate by a serigraphy method.

4. A method according to claim 3, wherein after the deposition, the ink is dried prior to step (b).

5. A method according to claim 1, step (b) is carried out in an air atmosphere for about 15 minutes.

6. An alumina ceramic substrate comprising weldable metallized zones or areas obtained by the method of claim 1.

* * * * *